United States Patent
Lewis et al.

(10) Patent No.: US 6,341,695 B1
(45) Date of Patent: *Jan. 29, 2002

(54) CONTAINMENT DEVICE FOR RETAINING SEMICONDUCTOR WAFERS

(75) Inventors: Lee Lewis, Murphy, TX (US); Kurodearimasu Takeshi Hirose, Ibaragi (JP); Jeffrey Wilson, Sherman, TX (US); James Dove, Rockwall, TX (US); Michael Hayden, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/571,654

(22) Filed: May 15, 2000

Related U.S. Application Data (63) Continuation-in-part of application No. 09/298,103, filed on Apr. 22, 1999, now Pat. No. 6,193,068.
(60) Provisional application No. 60/084,612, filed on May 7, 1998.

(51) Int. Cl.⁷ .......................... B65D 85/30; B65D 85/02; B65D 21/02
(52) U.S. Cl. ....................... 206/710; 206/303; 206/509; 206/722
(58) Field of Search ................................ 206/710–712, 206/724, 725, 303, 722; 220/4.21, 4.24, 324

(56) References Cited

U.S. PATENT DOCUMENTS

| | | | | |
|---|---|---|---|---|
| 3,552,548 A | * | 1/1971 | Wallestad et al. | 206/710 |
| 3,672,495 A | * | 6/1972 | Bauer et al. | 706/712 |
| 4,120,398 A | * | 10/1978 | Braddor, Sr. | 206/303 |
| 4,886,162 A | * | 12/1989 | Ambrogio | 206/710 |
| 5,024,329 A | * | 6/1991 | Grohrock | 206/710 |
| 5,103,976 A | * | 4/1992 | Murphy | 206/725 |
| 5,211,717 A | * | 5/1993 | Skoura | 206/710 |
| 5,284,802 A | * | 2/1994 | Muraoka et al. | 206/710 |
| 5,314,068 A | * | 5/1994 | Nakazato et al. | 206/710 |
| 5,363,963 A | * | 11/1994 | Allen | 220/324 |
| 5,366,079 A | * | 11/1994 | Lin et al. | 206/710 |
| 5,474,177 A | * | 12/1995 | Abrams et al. | 206/710 |
| 5,547,082 A | * | 8/1996 | Royer et al. | 206/725 |
| 5,553,711 A | * | 9/1996 | Lin et al. | 206/710 |
| 5,724,748 A | * | 3/1998 | Brooks et al. | 206/711 |
| 6,193,068 B1 | * | 2/2001 | Lewis et al. | 706/710 |

* cited by examiner

*Primary Examiner*—Bryon P. Gehman
(74) *Attorney, Agent, or Firm*—Wade James Brady, III; Frederick J. Telecky, Jr.

(57) ABSTRACT

A containment device for retaining semiconductor wafers (54) which includes a first housing member (10) having a frame (12), an inner wall (14) and an outer wall (16), the inner wall (14) and outer wall (16) having a spaced apart relationship forming a gap (18) therebetween. The inner wall (14) closely receives the semiconductor wafers (54). The containment device also includes a second housing member (36) that is securably attachable to the first housing member (10) and which has a frame (38) that forms the top of the containment device when the first and second housing members (10, 36) are securably attached together. The first and second housing members are secured by a plurality of latches (20), each with a hook (22) secured to the first housing member which passes through a hole (40) in the second housing member and is releasably secured within the hole by the hook. In accordance with a second embodiment of the invention, the latches and holes of the first embodiment are replaced with a plurality of rotatable latch members (64) which are secured to the first housing member and are rotatable about a hinge (70), each latch member (64) having a hook (66) at the distal end thereof for engagement with a hole (68) in the second housing member. One of the walls (16) of the first embodiment is removed and replaced with a liner of a very soft rubber or foam (62), preferably of an antistatic variety, which will absorb shock applied to the housing.

10 Claims, 9 Drawing Sheets

CONTAINMENT DEVICE FOR RETAINING SEMICONDUCTOR WAFERS

CROSS REFERENCE TO PRIOR APPLICATIONS

This application is a continuation-in-part of Ser. No. 09/298,103, filed Apr. 22, 1999 now U.S. Pat. No. 6,193,068, which claims priority based upon Provisional Application Ser. No. 60/084,612, filed May 7, 1998, the contents of both of which are incorporated herein by reference.

TECHNICAL FIELD OF THE INVENTION

This invention relates in general to a containment device and in particular to a containment device for retaining semiconductor wafers that provide for automated loading and unloading of the semiconductor wafers therein while minimizing the breakage of the semiconductor wafers during loading, unloading and transporting.

BACKGROUND OF THE INVENTION

Without limiting the scope of the present invention, its background will be described with reference to transporting semiconductor wafers from one site to another.

Heretofore in this field, it has been necessary to transport semiconductor wafers from one fabricating facility to another between certain steps in the fabrication process. The process for packaging the semiconductor wafers for transport was typically a manual process which required placing each of the semiconductor wafers into individual electrostatic discharge bags in order to prevent the buildup of static charge on the semiconductor wafer that may otherwise occur during handling. The static charge must be prevented in order to avoid causing short circuits within the semiconductor wafer.

Once the semiconductor wafers were placed into electrostatic discharge bags, the semiconductor wafers were placed into a styrofoam box. The styrofoam box was typically treated with a topical anti-static coating such as Staticide made by ACL Corporation or other quaternary compounds. The use of the topical anti-static coating on the styrofoam box further prevented the buildup of static charge during handling of the semiconductor wafers.

It has been found, however, that the use of styrofoam boxes can promote the corrosion of semiconductor wafers due to the potential moisture retention by the styrofoam. The typical process used to mold the styrofoam box is a steam process wherein beads of styrofoam are exposed to steam which causes them to expand and allows them to be formed into the shape of a box. If the styrofoam boxes are not properly dried, the residual moisture within the styrofoam box may cause corrosion of the semiconductor wafers.

The use of styrofoam boxes also left semiconductor wafers susceptible to breakage. For example, it is estimated that between one and three percent of semiconductor wafers were broken during the manual loading and unloading process as well as during transportation of the semiconductor wafers in the styrofoam box. In addition, the use of styrofoam boxes to transport silicon wafers resulted in high costs associated with the manufacture and disposal of the styrofoam boxes which, in most cases, were not re-used or recycled.

Therefore, a need has arisen for a containment device for retaining semiconductor wafers that will allow for automated loading and unloading of semiconductor wafers, thereby minimizing the breakage of semiconductor wafers associated with the transportation of semiconductor wafers from one facility to another. A need has also arisen for such a containment device that dissipates static charge without the need to manually place the semiconductor wafers within an electrostatic discharge bag. A need has further arisen for a containment device for retaining semiconductor wafers that does not promote corrosion of the semiconductor wafers. Additionally, a need has arisen for such a containment device that is re-usable, thereby minimizing both the manufacturing and disposal costs associated with transporting semiconductor wafers.

SUMMARY OF THE INVENTION

The present invention disclosed herein comprises a containment device for retaining semiconductor wafers that provides for automated loading and unloading of the semiconductor wafers therein while minimizing the breakage of the semiconductor wafers during loading, unloading and transporting. The containment device of the present invention dissipates static electricity through the use of electrically conductive materials and does not promote corrosion of the semiconductor wafers as the materials used do not retain moisture. Additionally, the containment device of the present invention is reusable, thereby reducing both the manufacturing and environmental costs associated with transporting semiconductor wafers.

The containment device in accordance with a first embodiment of the present invention comprises a first housing member having a frame, an inner wall and an outer wall. The inner and outer walls extend generally perpendicularly from the frame and have a spaced apart relationship forming a gap therebetween, the inner wall closely spaced from the semiconductor wafers when receiving the semiconductor wafers to prevent radial movement of the semiconductor wafer during transportation. The containment device also includes a second housing member that is securably attachable to the first housing member. The second housing member has a frame that forms the top of the containment device when the first and second housing members are securably attached together.

The inner and outer walls of the containment device each have a slot that allows for automated loading and unloading of semiconductor wafers. In addition, the inner wall has a notch for establishing the maximum depth of semiconductor wafers to be retained within the containment device. Both the frame of the first housing member and the frame of the second housing member may include reinforcement members for minimizing flexure of the containment device during transportation. The second housing member may further include a wall that extends generally perpendicularly from the frame of the second housing member that is disposed exteriorly of the outer wall of the first housing member when the first and second housing members are securably attached together. The frame of the second housing member may also include a spacer member that minimizes the axial movement of the semiconductor wafers within the containment device when the first and second housing members are securably attached together.

The first housing member and the second housing member are securably attached together using one or more latches that are hingably mounted to the first housing member. In first embodiments, each latch is attached to the first housing member and has a hook that is received and secured within a hole in the frame of the second housing member. The latches and holes receiving the latches are preferably positioned 180 degrees apart when two such latches are used and 90 degrees apart when four such latches are used, it being understood that the number of latches used can be any number greater than one. The use of, for example, four spaced apart latches as compared to two spaced apart latches provides for greater flattnes of the housing as the housing diameters increase, such as, for example up to 300 mm. The latches are disposed at comers or sides of the housing with the comers being preferred, especially when the housing is the preferred rectangular (square) shape, it being understood that the housing can have other shapes, such as, for example circular. Once the first housing member and the second housing member are securably attached together, similar containment devices may be stacked one on top of another using the respective lips of the first housing members and the second housing members. In accordance with a second embodiment, a rotatable flap is secured to the first housing member and has a hook on the distal end thereof for overlapping the second housing member and entering an aperture on the top of the second housing member to provide the latching action. A plurality of such rotatable flaps are used, the embodiment shown having two such flaps, it being understood that additional such flaps can also be provided in spaced relation in the same manner as discussed above with reference to the first embodiments.

Prior to loading the containment device with semiconductor wafers in accordance with the first embodiments, a cushion is placed in the bottom of the first housing member. A wafer separator is then place on top of the cushion. Thereafter, numerous semiconductor wafers are place within the containment device and closely received within the inner wall of the first housing member using an automated process. This process includes placing a wafer separator between each semiconductor wafer. Once the level of the semiconductor wafers reaches the notch of the inner wall of the first housing member, a cushion is placed on top of the last semiconductor wafer with a wafer separator therebetween. The second housing member may then be securely attached to the first housing member.

The materials selected for the containment device of the present invention must not only protect the semiconductor wafers from impacts or shocks to the exterior of the containment device but must also protect the semiconductor wafers from the ubiquitous build up of internal static. Specifically, the first and second housing members are constructed from a conductive material such as a carbon impregnated polypropylene. Similarly, the wafer separators are constructed from a conductive material which may be a carbon impregnated polyethylene. Additionally, the cushions used above and below the stack of semiconductor wafers may be constructed from an anti-static foam.

In accordance with the second embodiment of the invention, the outer wall is not provided and, instead, the remaining wall, which corresponds to the inner wall of the first embodiments, is lined with a very soft rubber or foam or the like, preferably of an antistatic variety, such pink polyethylene antistatic foam, which will absorb shock applied to the housing. This embodiment provides added shock protection and becomes more useful as the diameters of the wafers increase and/or as the thicknesses of the wafers decrease.

BRIEF DESCRIPTION OF THE DRAWINGS

For a more complete understanding of the present invention, including its features and advantages, reference is now made to the detailed description of the invention, taken in conjunction with the accompanying drawings in which like numerals identify like parts and in which.

DETAILED DESCRIPTION OF THE INVENTION

While the making and using of various embodiments of the present invention is discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

Figure 1:
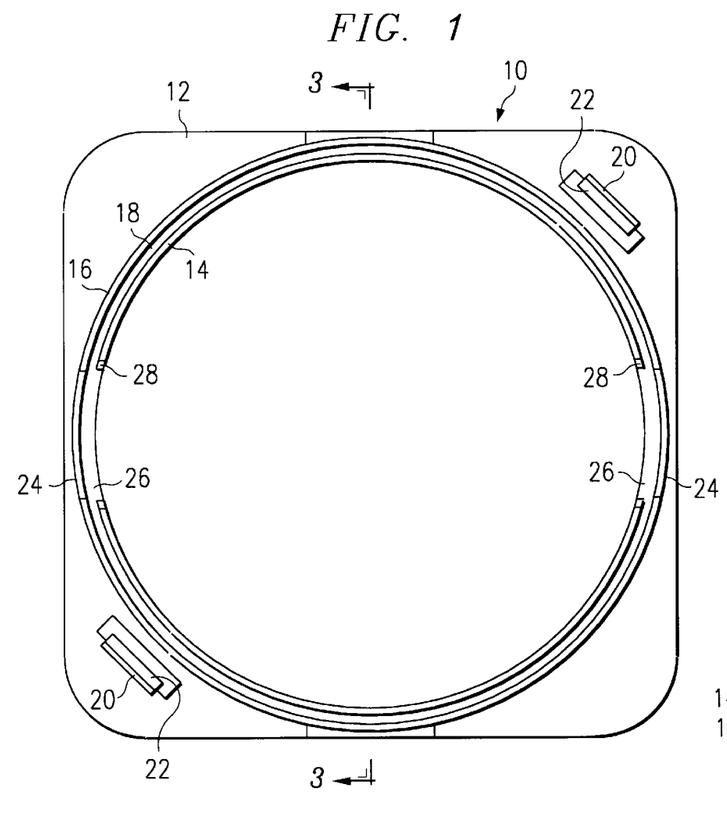
FIG. 1. is a top view of the lower portion of a containment device of the present invention.

Referring to FIG. 1, a lower housing member of a containment device for retaining semiconductor wafers is depicted and generally designated 10. Lower housing member 10 includes a substantially planar frame upon which semiconductor wafers will be placed. Extending generally perpendicularly from frame 12 is inner wall 14. Inner wall 14 is sized to closely receive the semiconductor wafers that will be retained within the containment device of the present invention. For example, inner wall 14 may be sized to receive 6 inch, 8 inch, 12 inch or other diameter semiconductor wafers. Also extending generally perpendicularly from frame 12 is an outer wall 16. Between inner wall 14 and outer wall 16 is a gap 18. Together outer wall 16 and gap 18 protect the semiconductor wafers from the direct transmission of forces that my contact outer wall 16 during the transportation of semiconductor wafers within the containment device of the present invention.

Figure 2:
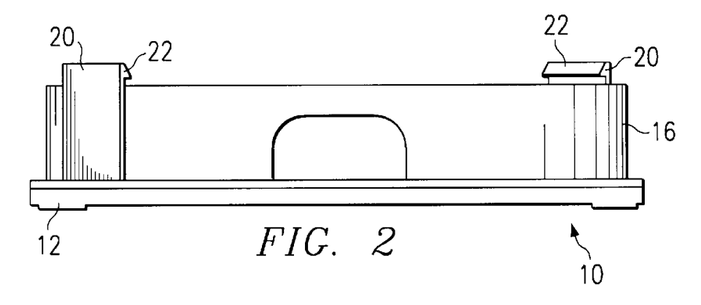
FIG. 2 is a side view of the containment device of FIG. 1.

As best seen in FIG. 2, a pair of latches 20 extend generally perpendicularly from frame 12. Each of the latches 20 includes a hook 22 that will securably attach lower housing member 10 to an upper housing member as will be more filly discussed with reference to FIG. 5.

Figure 3:
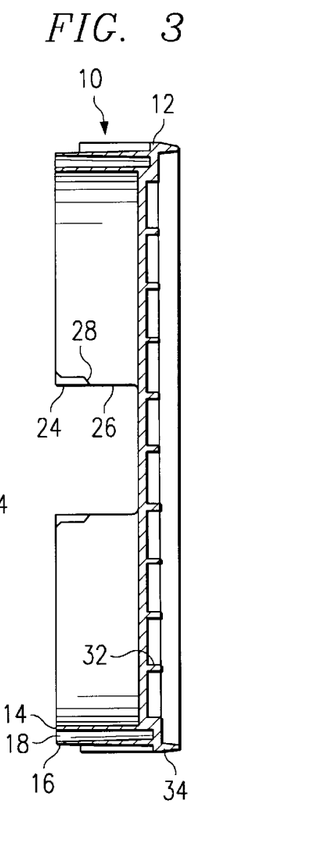
FIG. 3 is a cross sectional view of the containment device of the present invention taken along line 3—3 of FIG. 1.

Referring now to FIGS. 1 and 3, outer wall 16 includes a pair of oppositely disposed slots 24. Similarly, inner wall 14 has a pair of oppositely disposed slots 26. Together, slots 24 and slots 26 allow for the automated loading and unloading of semiconductor wafers using a typical wafer loading arm. In addition, inner wall 14 includes a pair of oppositely disposed notches 28 that are used to determine the maximum height for stacking semiconductor wafers within lower housing member 10 of the containment device of the present invention.

Figure 4:
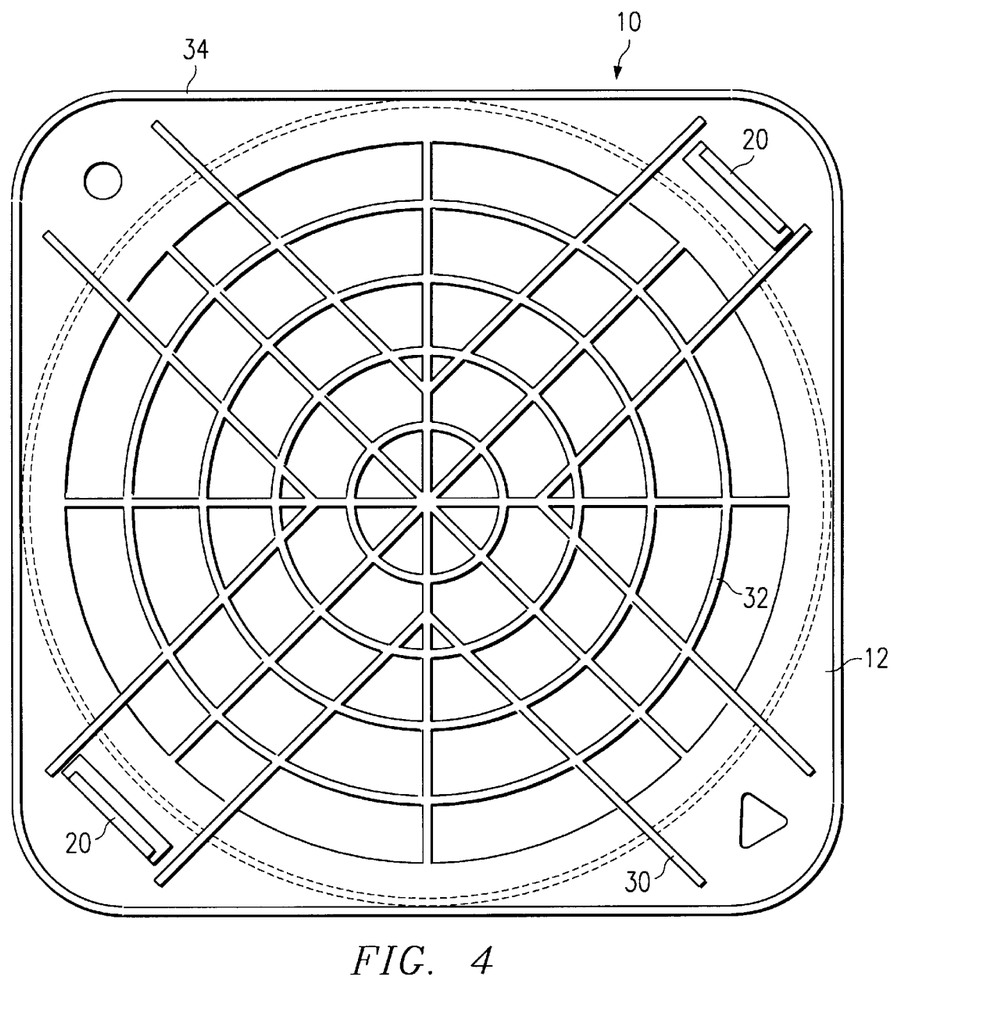
FIG. 4 is a bottom view of the lower portion of a containment device of the present invention.

Referring now to FIG. 4, a top view of lower housing member 10 is depicted. Frame 12 of lower housing member 10 includes a plurality of reinforcement members including ribs 30 and rings 32. As best seen in FIG. 3, rings 32, as well as ribs 30, extend outwardly from the bottom surface of frame 12 and prevent the flexure of frame 12 during, for example, loading, unloading and transporting semiconductor wafers within the containment device of the present invention. Additionally, frame 12 includes an outer lip 34 that will mesh with an outer lip of an upper housing member of the containment device of the present invention as will be more fully explained with reference to FIG. 5.

Lower housing member 10 may be constructed from any suitably rigid material that provides support and containment for the semiconductor wafers to be disposed therein. For example, lower housing member 12 may be constructed from a plastic such as polypropylene. In addition, it has been found that the use of a conductive material will minimize the buildup of static charge on the semiconductor wafers disposed within lower housing member 10. For example, a carbon impregnated polypropylene is suitable for discharging such static buildup.

Figure 5:
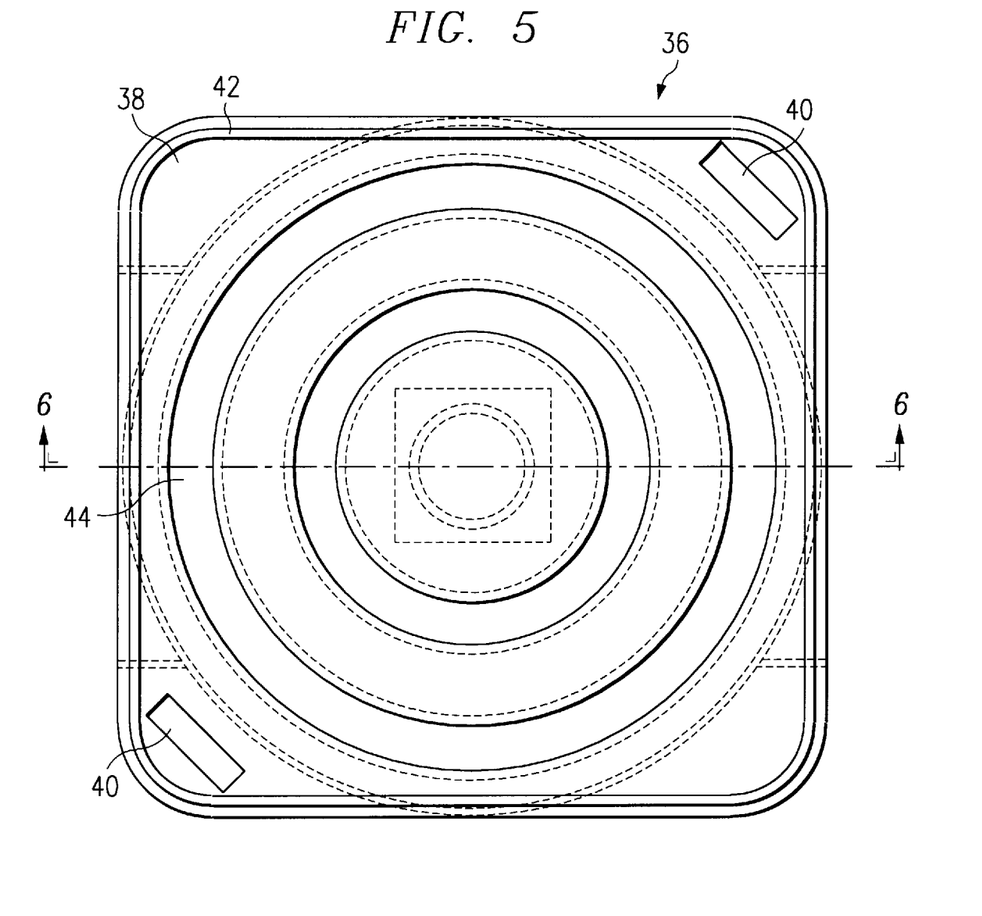
FIG. 5 is a top view of the upper portion of a containment device of the present invention.

Referring now to FIG. 5, a top view of the upper housing member is depicted and generally designated 36. Upper housing member 36 includes a frame 38 that is generally planar. Frame 38 includes a pair of oppositely disposed holes that are designed to receive hooks 22 of latches 20 of lower housing member 10. In operation, latches 20 are hingably attached to lower housing member 10 such that hooks 22 may be radially deflected outward as the inner surface of holes 40 come in contact with the angled surface of hooks 22 as best seen in FIG. 2. When hooks 22 extend above holes 40, latches 20 snap radially inwardly so that hooks 22 overlap the inner edge of holes 40 such that lower housing member 10 and upper housing member 36 are securably attached together.

Frame 38 of upper housing member 36 includes an outer lip 42. Outer lip 42 is sized such that it may be closely received within outer lip 34 of lower housing member 10 as best seen in FIG. 3. As such, similarly designed containment devices may be stacked together in a secure manner thereby preventing potential damage to the semiconductor wafers stored therein as the containment devices of the present invention are transported from one location to another.

Figure 6:
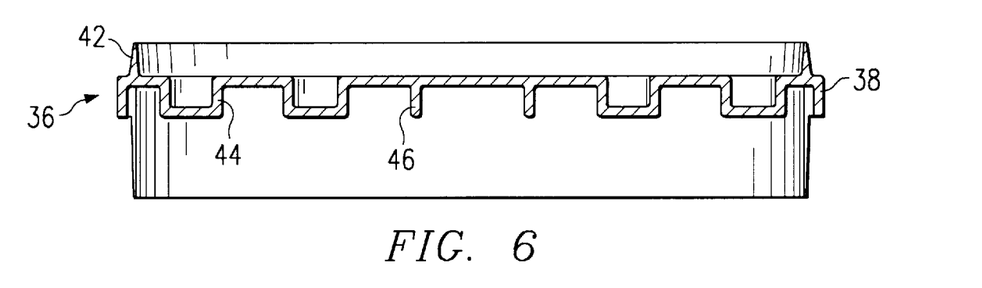
FIG. 6 is a cross sectional view taken along line 6—6 of FIG. 5.

As best seen in FIG. 6, frame 38 includes a series of reinforcement members in the form of concentric rings such as ring 44. The reinforcement members minimize the flexure of upper housing member 36 such that when upper housing member 36 and lower housing member 10 are securably attached together, protection is provided for the semiconductor wafers disposed therein. Inwardly extending from frame 38 is a spacer 46 that contacts the upper surface of the semiconductor wafers stacked within the containment device of the present invention. Spacer 46 minimizes the axial movement of the semiconductor wafers within the containment device of the present invention during the transportation of the semiconductor wafers.

Figure 7:
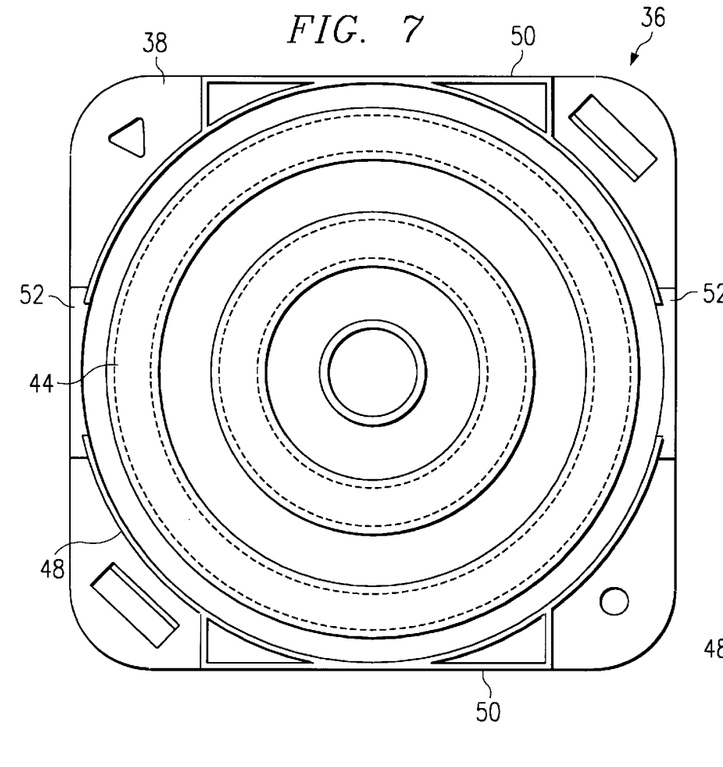
FIG. 7 is a bottom view of the upper portion of a containment device of the present invention.
Figure 8:
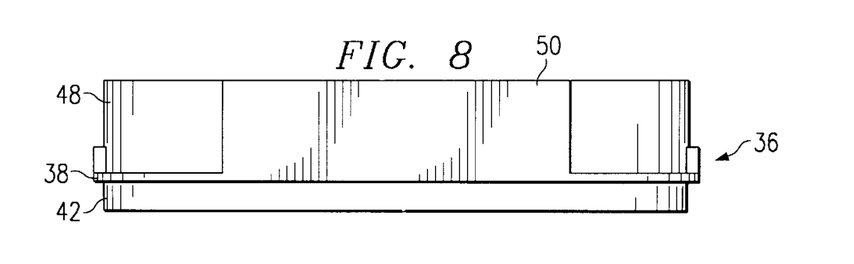
FIG. 8 is a side view of the upper portion of the containment device of FIG. 7.
Figure 9:
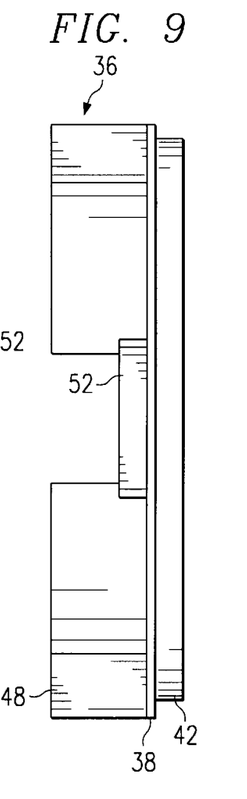
FIG. 9 is a side view of the upper portion of the containment device of FIG. 7.

Referring now to FIG. 7, a bottom view of upper housing member 36 is depicted. Upper housing member 36 has a wall 48 that extends generally perpendicularly to frame 38. Wall 48 is sized such that when upper housing member 36 is securably attached to lower housing member 10, wall 48 is exteriorly disposed about outer wall 16 of lower housing member 10. Upper housing member 36 also has a pair of oppositely disposed walls 50 that have a planar surface, as best seen in FIGS. 7 and 8. Walls 50 allow adjacent containment devices of the present invention to be packed tightly together in, for example, a shipping box or pallet. Additionally, upper housing member 36 has a pair of oppositely disposed planar walls 52 that provide for tight packing of adjacent containment devices as best seen in FIG. 9.

Figure 10:
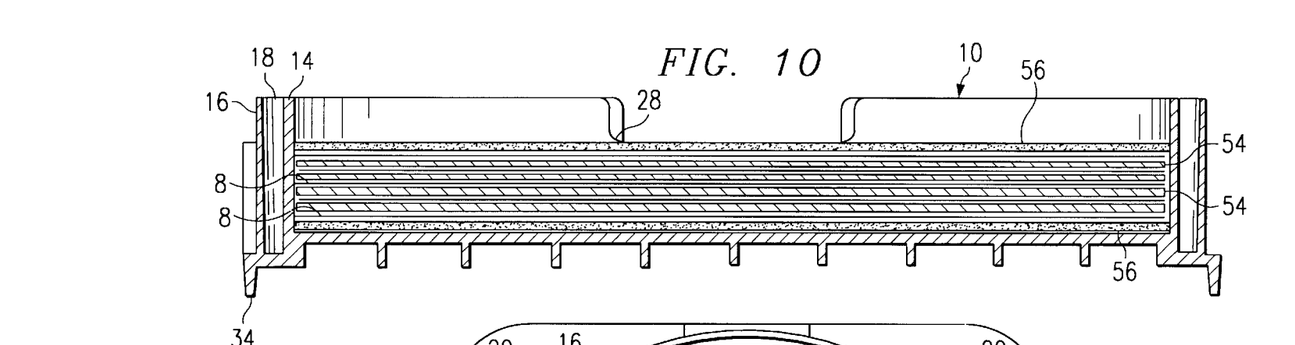
FIG. 10 is a cross sectional view of the lower portion of a containment device of the present invention having semiconductor wafers loaded therein.

Referring now to FIG. 10, a cross sectional view of lower housing member 10 loaded with a plurality of semiconductor wafers 54 is depicted. Prior to loading lower housing member 10 with semiconductor wafers 54, a cushion 56 is placed on the upper surface of frame 12. Cushion 56 provides protection to semiconductor wafers 54 from external shock. Cushion 56 may be constructed from an antistatic foam such that static charge will not develop between cushion 56 and a semiconductor wafer 54. On top of cushion 56 is a wafer separator 58. Wafer separator 58 is constructed from a conductive material having low ionic contamination and minimal loose particles. For example, wafer separator 58 may be constructed from a carbon impregnated polyethylene. The ionic contamination of wafer separator 58 should not exceed 20 ng/cm$^2$ of fluoride ions, chloride ions or sodium ions, should not exceed 30 ng/cm$^2$ of potassium ions or ammonium ions and should not exceed 40 ng/cm$^2$ of bromide ions, phosphate ions, nitride ions or sulfate ions. Additionally, wafer separator 58 should not have more than 100,000 loose particles per cubic foot that exceed 0.5 micrometers.

On top of wafer separator 58 is a semiconductor wafer 54. Thereafter, a plurality of wafer separators 58 and semiconductor wafers 54 may be stacked in sequence. On top of the last semiconductor wafer 54 there is a wafer separator 58. On top of the last wafer separator 58 is an additional cushion 56 that also protects semiconductor wafers 54 from impacts.

Figure 11:
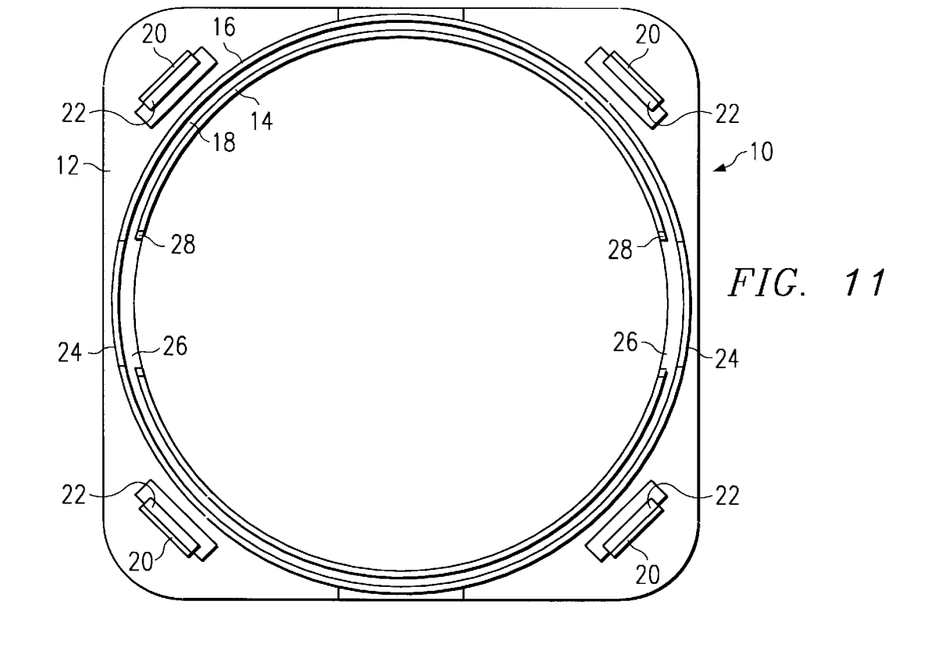
FIG. 11 is a top view of the lower portion of a containment device in accordance with a second form of the first embodiment of the present invention.
Figure 12:
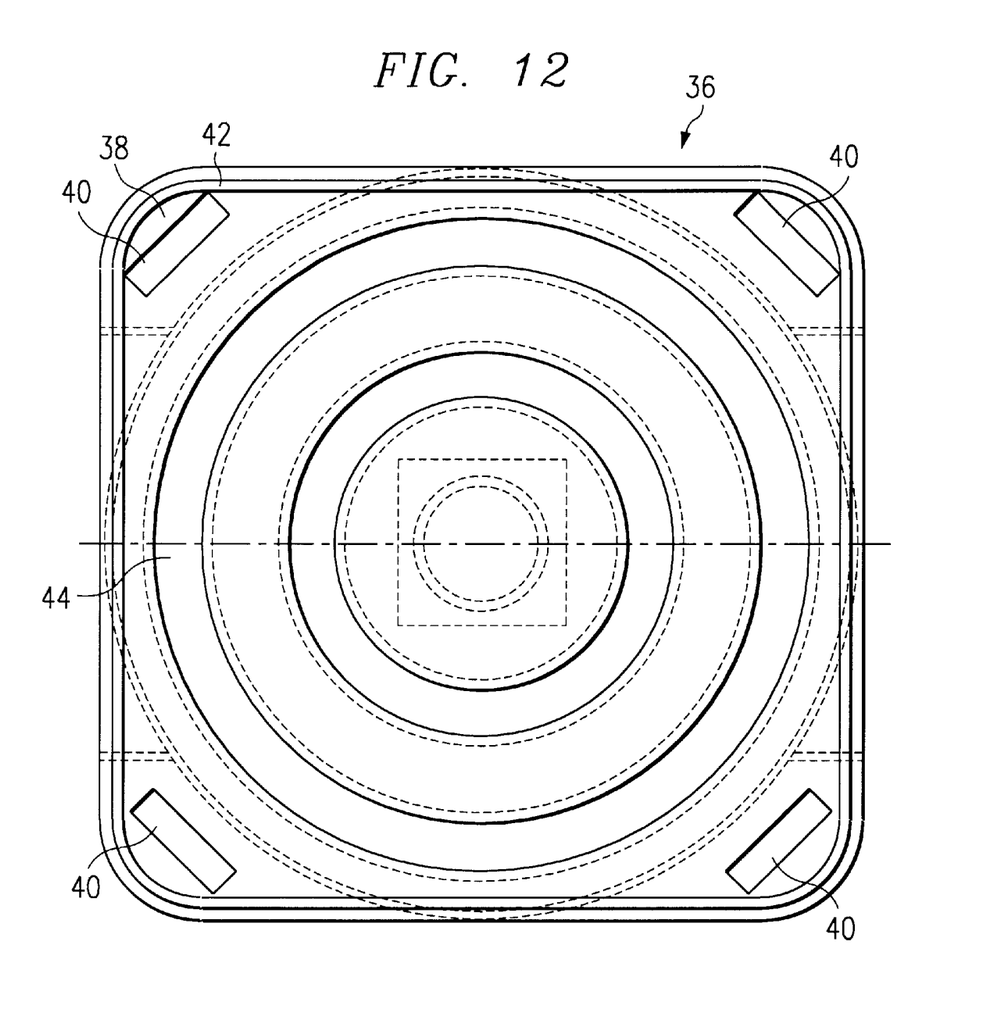
FIG. 12 is a top view of the upper portion of a containment device in accordance with a second form of the first embodiment of the present invention.
Figure 13:
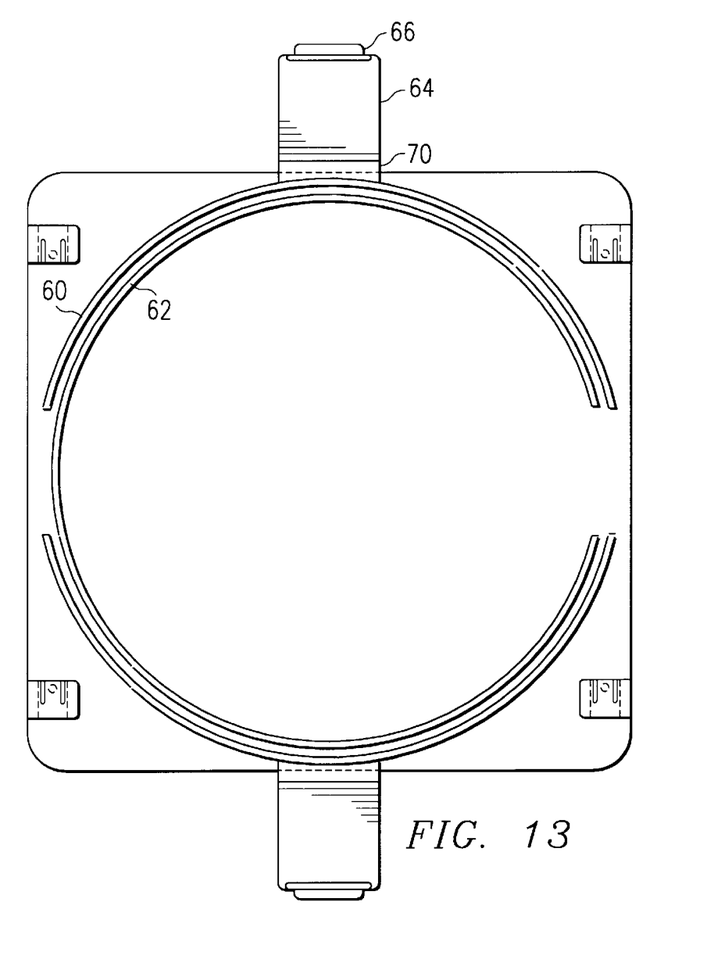
FIG. 13 is a top view of the bottom portion of a containment device in accordance with a second embodiment of the present invention.
Figure 14:
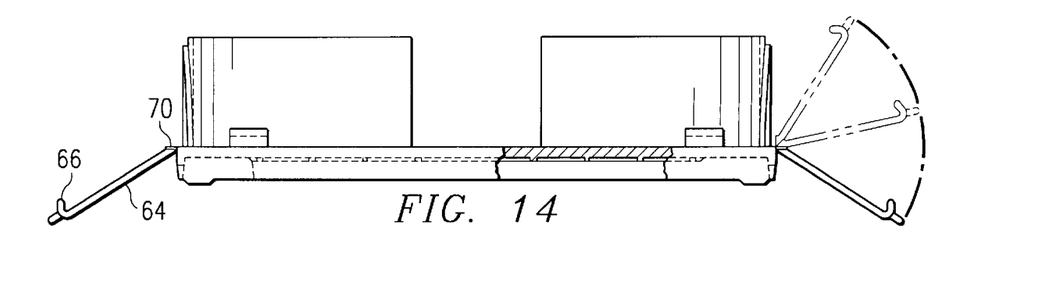
FIG. 14 is a side view of the bottom portion of FIG. 13.

Referring now to FIGS. 11 and 12 there is shown a second form in accordance with the first embodiment of the invention wherein all elements are identical to the first embodiment except that four latches 20, each with a hook 22, are provided, one latch at each corner of the lower housing and the upper housing includes four holes 40 for receiving the latches 20 and hooks 22. The operation is otherwise the same as in the first form of the first embodiment.

Figure 15:
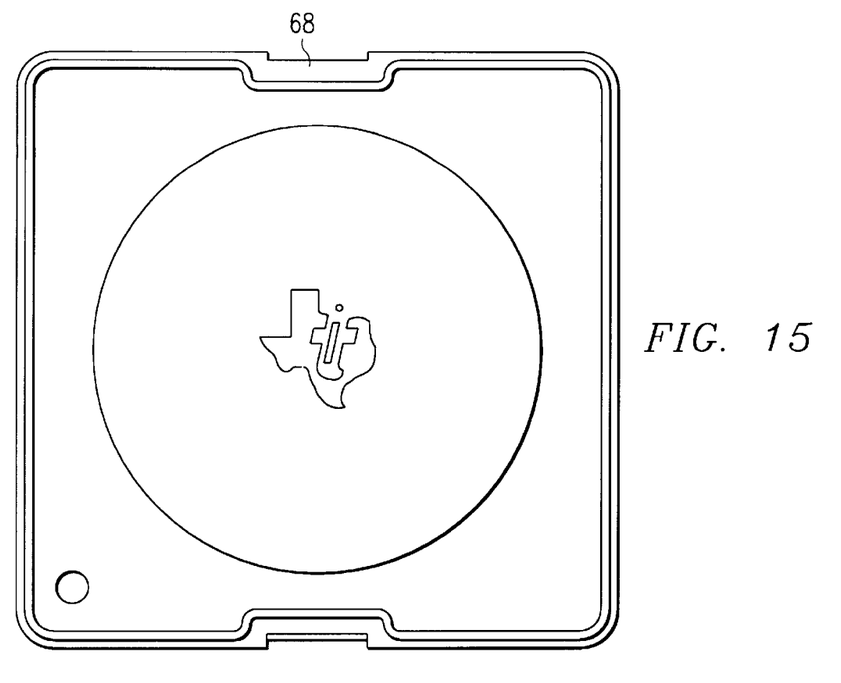
FIG. 15 is a top view of the upper housing portion in accordance with the second embodiment of the invention.
Figure 16:
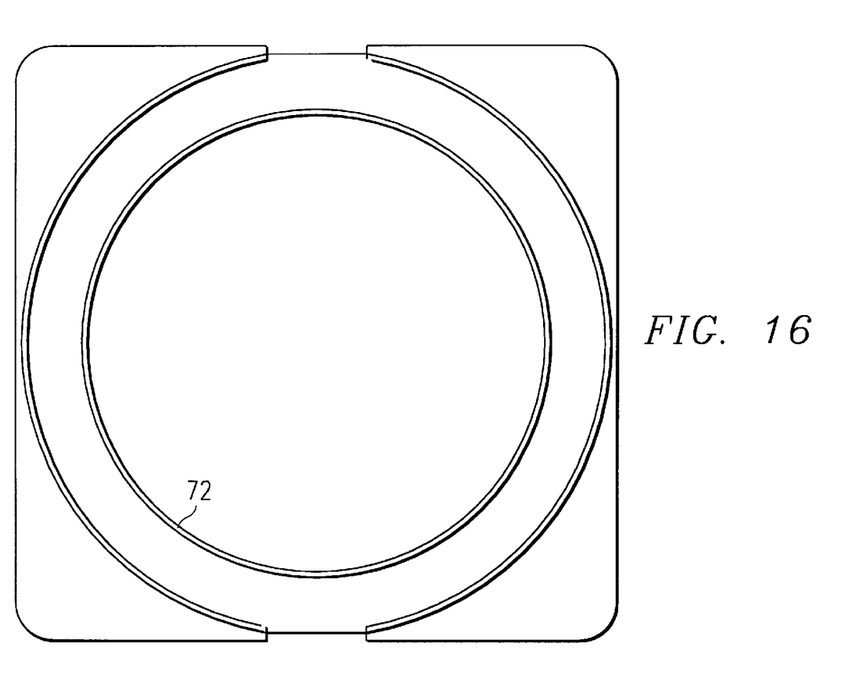
FIG. 16 is a bottom view of the upper housing portion in accordance with the second embodiment of the invention.
Figure 17:
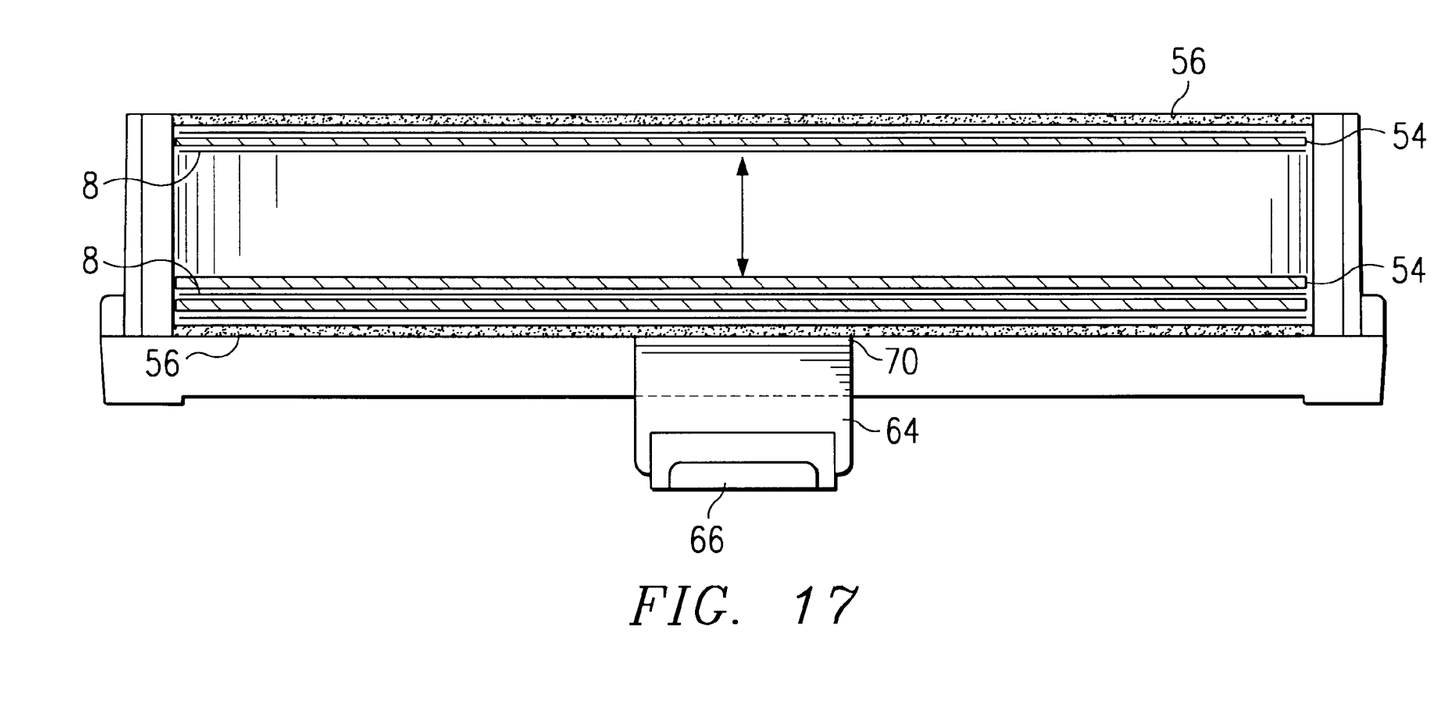
FIG. 17 is a cross sectional view of the second embodiment of the invention shown in assembled state.

Referring to FIGS. 13 to 17, there is shown a second embodiment in accordance with the present invention. In accordance with the second embodiment of the invention, the outer wall is not provided and, instead, the remaining wall 60, which corresponds to the inner wall of the first embodiments, is lined with a very soft rubber or foam or the like 62, preferably of an antistatic variety, such as pink polyethylene antistatic foam, which will absorb shock applied to the housing as shown in FIGS. 15 and 16. This embodiment provides added shock protection and becomes more useful as the diameters of the wafers increase and/or as the thicknesses of the wafers decrease. In accordance with this embodiment, the latches 20 with hooks 22 thereon and the holes 40 for receiving the latches are replaced, the latches being replaced by flaps 64 with hooks 66 at the distal end of each flap and the holes 40 are replaced with a recess 68 in the upper housing for receiving the hooks. The latches 64 are secured to the lower housing, preferably at the bottom of the lower housing as shown and are rotatable about a thinned or scored region 70 so that the latch can be rotated with the hook 66 travelling over the upper housing portion and into the recess 68 in the upper housing portion to provide the locking action and retain the upper and lower housing portions together. The latches 64 are preferably molded along with the lower housing as a single unit with the thin region or score region 70 provided as a part of the molding operation. The upper and lower housings are preferably polypropylene. The upper housing portion contains a downwardly depending member 72 at its inner surface which will impinge against the protective material disposed between the member 72 and the uppermost wafer to provide a minimal force which prevents the wafers from movement within the housing. The housing in accordance with the second embodiment is loaded in the same manner as described above with reference to the first embodiment and the materials for the housing portions are the same as described above with reference to the first embodiment. The upper and lower housing members are shown in assembled state in FIG. 17 with like character references depicting the same structures as in the first embodiments.

While this invention has been described with a reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A containment device for retaining semiconductor wafers comprising:
   a first housing member for retaining semiconductor wafers therein having a frame including a base portion; a circular inner wall and a circular outer wall, the inner and outer walls extending generally perpendicularly from the base portion of the frame, the inner and outer walls having a spaced apart relationship forming a gap therebetween, the inner wall adapted to receive the semiconductor wafers therewithin;
   a second housing member removably securably attached to the first housing member, the second housing member having a frame that forms the top of the containment device when the first and second housing members are securably attached together; and
   a plurality of latches hingedly mounted to the first housing member, said second housing member having means aligned with said latches for receiving said latches to removably secure said first housing member to said second housing member.

2. The device of claim 1 wherein said first housing member has a pair of opposing corners, said plurality of latches is two and said latches are disposed at the opposing corners of said first housing member.

3. The device of claim 1 wherein said means for receiving said latches are holes in said second housing member.

4. The device of claim 2 wherein said means for receiving said latches are holes in said second housing member.

5. The device of claim 1 wherein said first housing member has two pairs of opposing corners, said plurality of latches is four and said latches are disposed at said opposing corners of said first housing member.

6. The device of claim 5 wherein said means for receiving said latches are holes in said second housing member.

7. A containment device for retaining semiconductor wafers comprising:
   a first housing member for retaining semiconductor wafers therein having a frame including a base portion; a circular inner wall and a circular outer wall, the inner and outer walls extending generally perpendicularly from the base portion of the frame, the inner and outer walls having a spaced apart relationship forming a gap therebetween, the inner wall adapted to receive the semiconductor wafers therewithin;
   a second housing member removably securably attachable to the first housing member, the second housing member having a frame that forms the top of the containment device when the first and second housing members are securably attached together; and
   a plurality of latches hingedly mounted to the first housing member by a hinge and rotatable about the hinge, said second housing member having means aligned with said latches for receiving said latches, said latches extending over said second housing member and then extending to said means for receiving said latches to removably secure said first housing member to said second housing member.

8. The device of claim 7 wherein said latches are mounted at a portion of said first housing member at a location on said first housing member remote from said second housing member.

9. The device of claim 8 wherein said second housing member includes an opening therein aligned with each of said latches and each of said latches includes a hook portion at the distal end thereof remote from said hinge portion for securing each said latch within each said opening.

10. The device of claim 7 wherein said second housing member includes an opening therein aligned with each of said latches and each of said latches includes a hook portion at the distal end thereof remote from said hinge portion for securing each said latch within each said opening.

* * * * *